United States Patent [19]
Yoshida

[11] Patent Number: 5,175,599
[45] Date of Patent: Dec. 29, 1992

[54] MOS SEMICONDUCTOR DEVICE

[75] Inventor: Masayuki Yoshida, Yokohama, Japan

[73] Assignee: Kabushiki Kaisha Toshiba, Kawasaki, Japan

[21] Appl. No.: 817,981

[22] Filed: Jan. 8, 1992

Related U.S. Application Data

[63] Continuation of Ser. No. 554,155, Jul. 19, 1990, abandoned, which is a continuation of Ser. No. 853,669, Apr. 18, 1986, abandoned.

[30] Foreign Application Priority Data

Apr. 19, 1985 [JP] Japan .................. 60-83970

[51] Int. Cl.$^5$ .................. H01L 29/10; H01L 29/78; H01L 39/86
[52] U.S. Cl. .................. 257/327; 257/402
[58] Field of Search .............. 357/23.12, 41, 42, 23.1, 357/23.4, 23.3, 23.9, 20, 88, 89

[56] References Cited

FOREIGN PATENT DOCUMENTS 53-141585 12/1978 Japan .................. 357/23.12
55-151363 11/1980 Japan .................. 357/23.12
58-138066  8/1983 Japan .................. 357/23.1

OTHER PUBLICATIONS

Shoji Shukuri et al., "Submicron Channel MOSFET Using Focused Boron Ion Beam Implantation into Silicon" Extended Abstract of the 16th (1984 International) Conference on Solid State Devices and Materials Kobe, pp. 91–94, Aug. 30, 1984.

Primary Examiner—Andrew J. James
Assistant Examiner—Ngan Van Ngo
Attorney, Agent, or Firm—Finnegan, Henderson, Farabow, Garrett and Dunner

[57] ABSTRACT

An MOS semiconductor device has $n^{30}$-type source and drain regions in the main surface of a $p^{30}$-type monocrystalline silicon substrate. A $p^{30}$-type channel region is formed between the source and drain regions. A gate oxide film is provided on the main surface of the channel region, and a gate electrode is formed on the gate oxide film. In the portion of the monocrystalline silicon substrate between the source and drain regions, an inversion layer control region having an impurity concentration lower than that of the substrate is buried adjacent to the drain region. When a voltage is applied between the source and drain regions, the inversion layer control region maintains up to a high voltage an n-type inversion layer formed in the channel region.

35 Claims, 2 Drawing Sheets

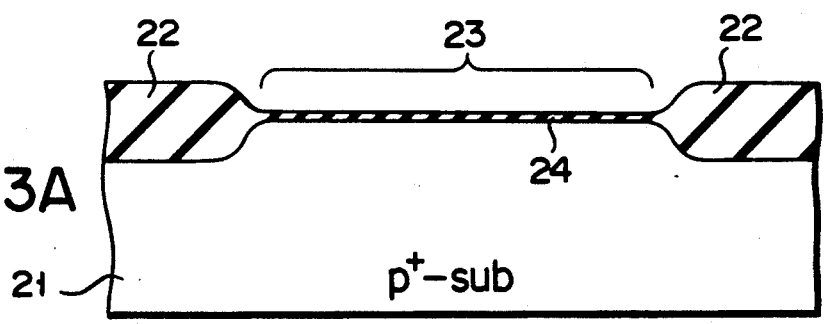
F I G. 3A
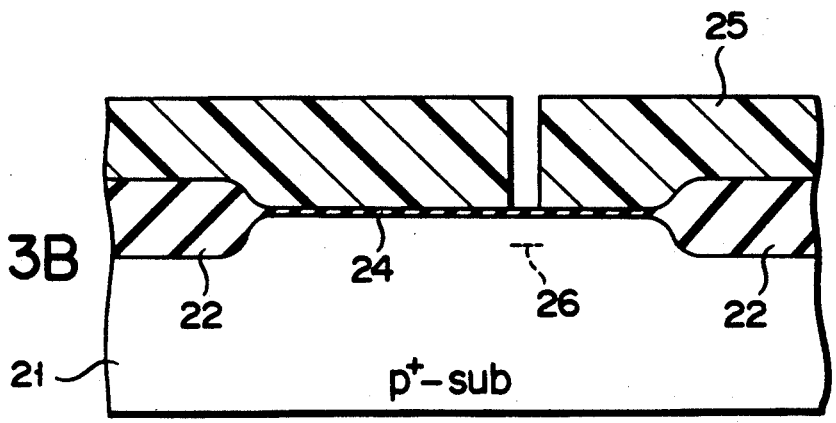
F I G. 3B

MOS SEMICONDUCTOR DEVICE

This application is a continuation of application Ser. No. 07/554,155, filed Jul. 19, 1990, which is a continuation of Ser. No. 06/853,669, filed Apr. 18, 1986, both now abandoned.

BACKGROUND OF THE INVENTION

The present invention relates to an MOS semiconductor device with a semiconductor substrate of a first conductivity type having a high impurity concentration for preventing punch-through between the source and drain regions.

An MOS semiconductor device such as an n-channel MOS transistor comprises a p-type monocrystalline silicon substrate, an element isolation region (a field oxide film) formed on the main surface of the substrate to form a plurality of islands in the substrate, n+-type source and drain regions formed in the main surface of this island substrate region to be mutually isolated, a gate oxide film formed on the surface of the channel region between the source and drain regions, and a gate electrode formed on the gate oxide film to oppose the channel region therethrough.

With advances in the micropatterning of LSIs using this type of MOS semiconductor, reduced channel lengths have brought about increases in current drive capacity and LSI switching speeds. As channel length is reduced, however, the source and drain regions become closer together, resulting in punch-through in the area therebetween.

As a result, a conventional n-channel MOS transistor like the one shown in FIG. 1 has been developed. This transistor uses a high impurity concentration monocrystalline silicon substrate to prevent punch-through. In FIG. 1, reference numeral 11 denotes a p+- type monocrystalline silicon substrate. Element isolation region (field oxide film) 12 is formed on the main surface of substrate 11 to divide the surface of substrate 11 into a plurality of islands. N+-type source and drain regions 13 and 14 are formed to be mutually separated in the main surface of the island substrate region. The surface of the substrate between source and drain regions 13 and 14 serves as channel region 11b. Oxide film 16 is formed on the surface of region 11b. Gate electrode 15 is then formed on the film 16 to oppose region 11b therethrough. Since substrate 11 in an MOS transistor having this type of structure has a high impurity concentration, it is possible to control spreading of a depletion layer between channel region 11b and source and drain regions 13 and 14. Hence, punch-through can be prevented. Giving substrate 11 a high impurity concentration, however, also results in a reduced pinch-off voltage (to be described later) and makes it impossible to obtain a sufficiently large current flow between regions 13 and 14.

More specifically, assume that voltages of 0 V, 50 mV, and 5 V are applied to source region 13, drain region 14, and gate electrode 15, respectively, in the MOS transistor shown in FIG. 1. Inversion layer 17 is induced in the surface of the channel region, and a current flows through this layer from region 13 to region 14. Depletion layer 18 from electrode 15 to the channel region, shown by the broken line, extends from regions 13 and 14 in the direction of the channel region and substrate 11 as shown by the broken lines to become depletion layers 19 and 20. A negative fixed charge exists within depletion layers 18 to 20. Given these conditions, if the voltage being applied to region 14 is increased to 5 V in order to create a pentode operation region, the depletion layer extends as shown by the broken line in FIG. 2. Here, as opposed to the case of FIG. 1, inversion layer 17 does not appear evenly throughout the surface of region 11b but instead depletes around region 14. This boundary (shown in the diagram by reference numeral 10) is called the pinch-off point. Likewise, a region which has depleted as far as the surface is called a pinch-off region, and the drain voltage that occurs in the pinch-off region is called the pinch-off voltage. When the gate voltage is constant, the drain current increases along with the increase in drain voltage. If the gate voltage becomes larger than the pinch-off voltage, however, the drain current is saturated and becomes constant. Pinch-off point 10 has a potential somewhere between the voltages applied to the source and drain regions (from 0 to 5 V), and p+-type substrate 11 is grounded. This has the same effect as applying a back bias to substrate 11, and the channel region becomes increasingly difficult to invert. As a result, creation of a pinch-off region becomes easy.

SUMMARY OF THE INVENTION

It is an object of the present invention to provide an MOS semiconductor device which prevents the occurrence of punch-through caused by reduced channel length and which offers improved current drive capacity.

The semiconductor device of the present invention comprises a semiconductor substrate of a first conductivity type having a high impurity concentration and a main surface; source and drain regions of a second conductivity type formed in the main surface of the semiconductor substrate to be mutually separated, a channel region being defined in the surface of the substrate between the source and drain regions; an insulating film formed on the main surface of the channel region; a gate electrode formed on the surface of the insulating film to oppose the channel region; and an inversion layer control region of the first conductivity type buried in the substrate adjacent to the drain region and having an impurity concentration lower than that of the substrate, whereby when a reverse bias is applied gate electrode, an inversion layer of the second conductivity type and having a predetermined thickness is formed in the channel region and is maintained by the inversion layer control region to a high voltage.

BRIEF DESCRIPTION OF THE DRAWINGS

FIGS. 3A to 3D are sectional views showing steps in the manufacture of an n-channel MOS transistor according to an embodiment of the present invention;

DETAILED DESCRIPTION OF THE PREFERRED EMBODIMENT

Figure 1:
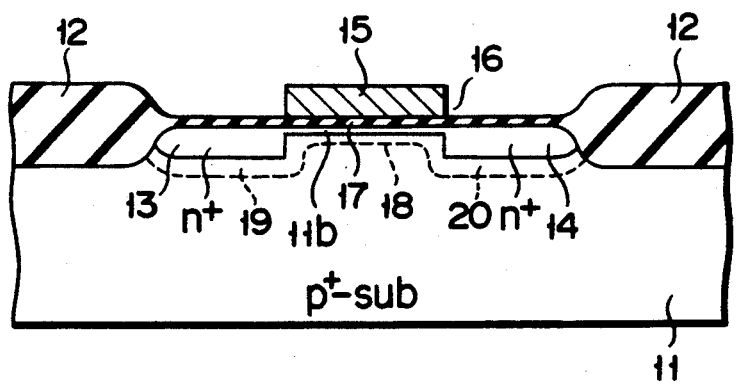
FIG. 1 is a sectional view of a conventional n-channel MOS transistor.

An n-channel MOS semiconductor device according to an embodiment of the present invention and a method of manufacturing the same will now be described in detail with reference to the accompanying drawings.

First, field oxide film 22 was formed by a normal LOCOS method on the main surface of p+-type monocrystalline silicon substrate 21, having a boron concentration of $1 \times 10^{17}$ cm$^{-3}$. Thermal oxidation was performed on substrate 21, and gate oxide film 24 having a thickness of 250 Å was formed on the main surface of substrate region 23, which was divided into islands by film 22 (FIG. 3A).

Resist pattern 25, having an opening for the formation of an inversion layer control region, was formed by photolithography. N-type impurity arsenic was then ion-implanted at an acceleration voltage of 180 kV and a dose of $2 \times 10^{12}$ cm$^{-2}$ using pattern 25 as a mask to form arsenic-doped layer 26, having a concentration peak at a predetermined depth from the main surface of substrate 21 (FIG. 3B).

Figure 3C:
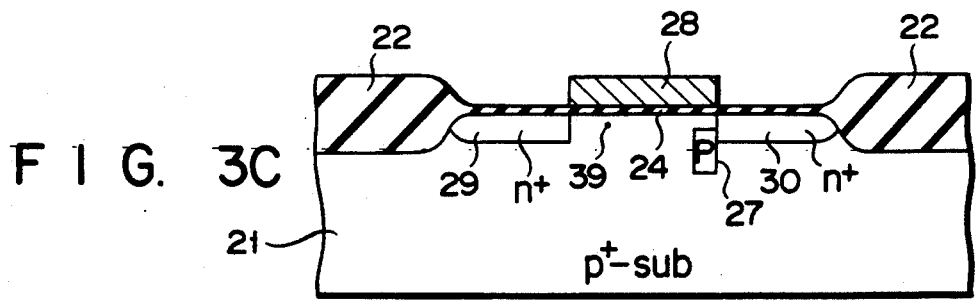

After removing pattern 25, the substrate was annealed at a temperature of 900° C. to diffuse the arsenic in layer 26. P-type inversion layer control region 27, having an impurity concentration of $2 \times 10^{16}$ cm$^{-3}$, was then formed at a predetermined depth from the surface of substrate 21 by the neutralization of the diffused arsenic and the boron within substrate 21. Note that region 27 is formed in substrate 21 such that the distance between the end of region 27 facing the main surface of substrate 21 and the main surface of substrate 21 is greater than the thickness of inversion layer 35 formed in the channel region (to be described later) of substrate 21. Next, a polycrystalline silicon film was deposited to a thickness of 3,500 Å over the entire surfaces of films 22 and 24 and patterned to form gate electrode 28. It is also possible to implant an impurity in the prospective channel region formation region for the purpose of threshold control prior to the formation of electrode 28. N-type impurity arsenic was then ion-implanted in substrate 21 at an acceleration voltage of 50 kV and a dose of $1 \times 10^{15}$ cm$^{-2}$ using electrode 28 as a mask. Annealing was performed to activate the arsenic and form mutually separated n+-type source and drain regions 29 and 30 in the substrate 21. Channel region 39 was defined in the surface of substrate 21 between regions 29 and 30. When a voltage is applied between regions 29 and 30, inversion layer 35, which inverts to an n-type layer and causes the area between regions 29 and 30 to conduct, is formed in region 39. Note that impurity implantation and annealing were performed such that: 1) the length of channel region 39 is 1.1 μm; 2) inversion layer control region 27 is positioned adjacent to region 30 between regions 29 and 30 in substrate 21; and 3) the end of region 27 facing away from the main surface of substrate 21 projects from region 30 (FIG. 3C).

Figure 3D:
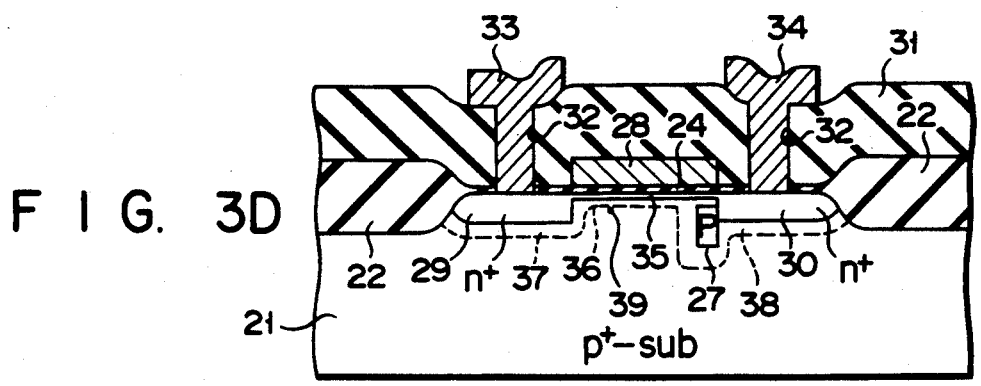

CVD-SiO$_2$ passivation film 31 was then deposited over the surfaces of films 22 and 24 and electrode 28. Contact holes 32, reaching from film 31 through film 24 to source and drain regions 29 and 30, were formed. Aluminum was deposited on film 31 and patterned to form Al wiring regions 33 and 34, which are connected to regions 29 and 30, respectively, through contact holes 32 (FIG. 3D).

Figure 2:
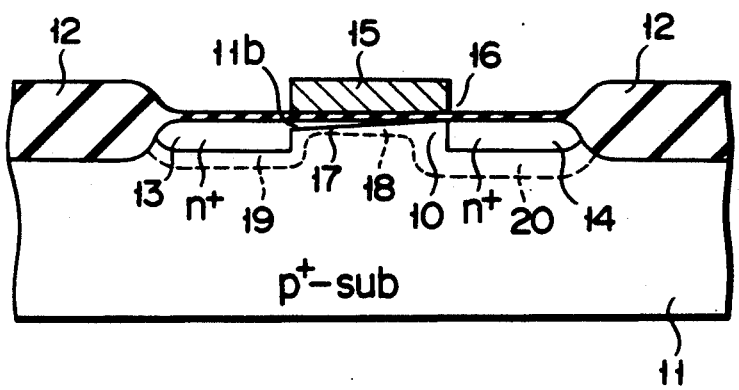
FIG. 2 is a sectional view showing the state of the transistor in FIG. 1 in a pentode operation region.
Figure 4:
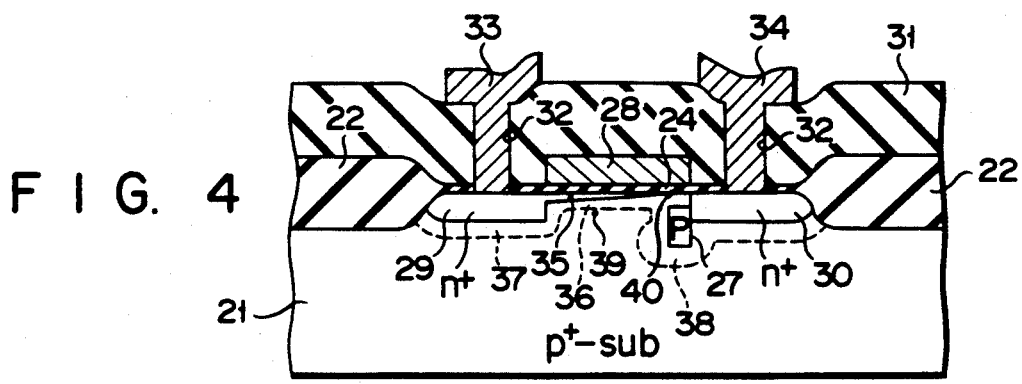
FIG. 4 is a sectional view showing the operation of the transistor of the present invention.
Figure 5:
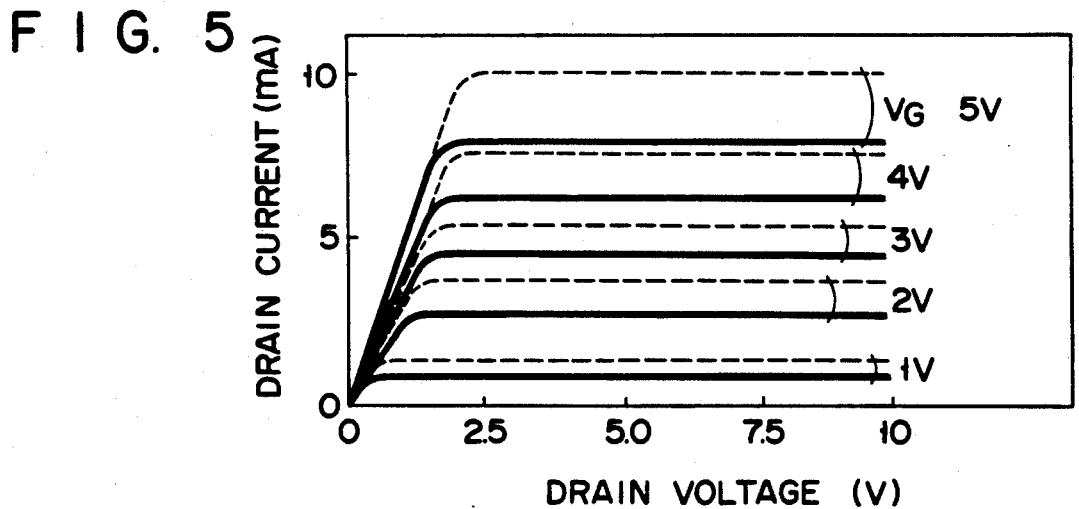
FIG. 5 is a graph showing Drain Voltage and Drain current characteristics of an n-channel MOS transistor according to the present invention and a conventional n-channel MOS transistor.

In an n-channel MOS semiconductor device manufactured in this way, assume that voltages of 0 V, 50 mV, and 5 V are applied to source region 29, drain region 30, and gate electrode 28, respectively. As shown in FIG. 3D, inversion layer 35 is induced in the main surface side of channel region 39, and a current flows through layer 35 from region 29 to region 30. Depletion layers 36 to 38, indicated by the broken lines, spread parallel to electrode 28 from source and drain regions 29 and 30 toward channel region 39. A negative fixed charge is present in these depletion layers. When the voltage being applied to region 30 is increased to 5 V in order to create a pentode operation region, depletion layers 36 to 38 grow as shown in FIG. 4. Since p-type inversion layer control region 27 having an impurity concentration lower than that of substrate 21 is present adjacent to region 30, the back gate bias effect on pinch-off point 40 can be reduced over the conventional device shown in FIG. 2. In addition, inversion layer 35 can be maintained to a higher voltage than in conventional devices. As a result, the possibility of pinch-off in channel region 39 is reduced, and it becomes possible to increase the drain current, that is, the drain saturation current, in the pentode operation region. The relationship between drain voltage (VD) and drain current (ID) was sought for an n-channel MOS transistor according to the present embodiment and for the conventional transistor shown in FIG. 2 (having a p+-type monocrystalline silicon substrate with a boron concentration of $1 \times 10^{17}$ cm$^{-3}$). The results are shown in FIG. 5. The dotted lines show characteristics of the transistor of the present embodiment, and the solid lines show characteristics of the conventional transistor. As is clear from FIG. 5, the transistor of the present embodiment offers a comparatively large drain saturation current. In addition, punch-through between regions 29 and 30 due to reduced channel length is prevented by using a p+-type monocrystalline silicon substrate and by increasing the impurity concentration of channel region 39. Hence, by preventing punch-through and increasing the drain saturation current, the transistor of the present invention can increase current drive capacity even when channel length is reduced.

In this embodiment, the inversion layer control region is formed to be separated from the main surface of the substrate by a distance greater than the thickness of the inversion layer. A distance equal to the thickness of the inversion layer is, however, sufficient to effectively prevent punch-through.

In this embodiment, silicon was used as a semiconductor substrate material, but other semiconductors such as Ga and As may also be used.

In this embodiment, a channel length of 1.1 μm and a boron concentration (in the substrate) of $1 \times 10^{17}$ cm$^{-3}$ were used. The preferable channel length range is 1.0 to 1.2 μm, and the preferable impurity concentration range is $5 \times 10^{16}$ to $3 \times 10^{17}$ cm$^{-3}$. The impurity concentration of the inversion layer control region was set at $2 \times 10^{16}$ cm$^{-3}$ in this embodiment, and the preferable range is $1 \times 10^{16}$ to $3 \times 10^{16}$ cm$^{-3}$.

In this embodiment, the inversion layer control region was formed alongside the source and drain regions by ion implantation using a resist pattern as a mask. It is also possible, however, to form the region by injecting a focused ion beam.

In this embodiment, an n-channel MOS field effect transistor was described. The present invention can also be applied, however, to a p-channel MOS or CMOS transistor.

What is claimed is:

1. An MOS semiconductor device having a pentode operation region, comprising:
   a semiconductor substrate of a first conductivity type having a high impurity concentration and a main surface;
   source and drain regions of a second conductivity type formed in the main surface of said semiconductor substrate to be mutually separated, a channel region being defined in the surface of said substrate between said source and drain regions;
   an insulating film formed on the main surface of said channel region;
   a gate electrode formed on the surface of said insulating film to oppose said channel region therethrough; and
   inversion layer control means of the first conductivity type buried in said substrate adjacent to said drain region and not adjacent to said source region and having an impurity concentration lower than that of said substrate, for forming an inversion layer of the second conductivity type and having a predetermined thickness in said channel region when a reverse bias is applied to the gate electrode and for maintaining the inversion layer up to a high voltage to reduce the possibility of pinch-off.

2. A device according to claim 1, wherein said semiconductor substrate comprises a monocrystalline silicon substrate.

3. A device according to claim 2, wherein said semiconductor substrate comprises a p$^+$-type substrate, said inversion layer control means comprises a p-type region, and said source and drain regions comprise n$^+$-type regions.

4. A device according to claim 3, wherein said inversion layer control means is separated from the main surface of said substrate by a distance not less than the thickness of said inversion layer.

5. A device according to claim 4, wherein the end of said inversion layer control means facing away from the main surface of said substrate projects from said drain region.

6. A device according to claim 3, wherein said channel region has a channel length of 1.0 to 1.2 μm, and said semiconductor substrate has an impurity concentration of $5 \times 10^{16}$ to $3 \times 10^{17}$ cm$^{-3}$.

7. A device according to claim 6, wherein said inversion layer control means has an impurity concentration of $1 \times 10^{16}$ to $3 \times 10^{16}$ cm$^{-3}$.

8. A device according to claim 1, wherein the inversion layer control means is formed by ion implanting an impurity of the second conductivity type into the substrate to have a concentration peak at a predetermined depth from the main surface of the substrate.

9. A device according to claim 3, wherein the inversion layer control means is formed by ion implanting an impurity of the second conductivity type into the substrate to have a concentration peak at a predetermined depth from the main surface of the substrate.

10. A device according to claim 4, wherein the inversion layer control means is formed by ion implanting an impurity of the second conductivity type into the substrate to have a concentration peak at a predetermined depth from the main surface of the substrate.

11. A device according to claim 7, wherein the inversion layer control means is formed by ion implanting an impurity of the second conductivity type into the substrate to have a concentration peak at a predetermined depth from the main surface of the substrate.

12. A semiconductor device having a pentode operation region, comprising:
    semiconductor substrate means of a first conductivity type, having a main surface, and having a high impurity concentration, for reducing the possibility of punch-through;
    source and drain regions of a second conductivity type formed in the main surface of said semiconductor substrate means to be mutually separated, a channel region being defined in the surface of said substrate means between said source and drain regions;
    an insulating film formed on the main surface of said channel region;
    gate electrode means, formed on the surface of said insulating film to oppose said channel region, for forming an inversion layer of the second conductivity type in said channel region when a gate voltage is applied to the gate electrode means; and
    inversion layer control means of the first conductivity type, buried in said substrate means adjacent to said drain region and not adjacent to said source region, and having an impurity concentration lower than that of said substrate means, for maintaining the inversion layer up to a high drain voltage to reduce the possibility of pinch-off.

13. A semiconductor device in accordance with claim 12, in which the channel region has a high impurity concentration for preventing a depletion layer from extending from the source region to the drain region during pentode operation of the semiconductor device.

14. A semiconductor device in accordance with claim 13, in which the semiconductor device comprises an MOS field effect transistor.

15. A semiconductor device in accordance with claim 12, in which the semiconductor device comprises an MOS field effect transistor.

16. A semiconductor device in accordance with claim 12, 13, 14, or 15, in which the end of the inversion layer control means facing away from the main surface of the substrate means projects from the drain region.

17. A semiconductor device in accordance with claim 12 or 13, in which the channel region has a channel length of less than 2 microns.

18. A semiconductor device in accordance with claim 14 or 15, in which the channel region has a channel length of less than 2 microns.

19. A semiconductor device in accordance with claim 18, in which the channel region has a channel length of not more than 1.2 microns.

20. A semiconductor device in accordance with claim 19, in which the channel region has a channel length of about one micron.

21. A semiconductor device in accordance with claim 14 or 15, in which the semiconductor substrate means has an impurity concentration of at least $5 \times 10^{16}$ cm$^{-3}$.

22. A semiconductor device in accordance with claim 21, in which the semiconductor substrate means has an impurity concentration of not more than $3 \times 10^{17}$ cm$^{-3}$.

23. A semiconductor device in accordance with claim 14 or 15, in which the semiconductor substrate means has an impurity concentration of not more than $3 \times 10^{17}$ cm$^{-3}$.

24. A semiconductor device in accordance with claim 23, in which the inversion layer control means has an impurity concentration of not more than $3\times 10^{17}$ cm$^{-3}$.

25. A semiconductor device in accordance with claim 24, in which the inversion layer control means has an impurity concentration of at least $1\times 10^{16}$ cm$^{-3}$.

26. A semiconductor device in accordance with claim 22, in which the inversion layer control means has an impurity concentration of not more than $3\times 10^{16}$ cm$^{-3}$.

27. A semiconductor device in accordance with claim 26, in which the inversion layer control means has an impurity concentration of at least $1\times 10^{16}$ cm$^{-3}$.

28. A semiconductor device in accordance with claim 21, in which the inversion layer control means has an impurity concentration of not more than $3\times 10^{16}$ cm$^{-3}$.

29. A semiconductor device in accordance with claim 28, in which the inversion layer control means has an impurity concentration of at least $1\times 10^{16}$ cm$^{-3}$.

30. A semiconductor device in accordance with claim 18, in which the inversion layer control means has an impurity concentration of not more than $3\times 10^{16}$ cm$^{-3}$.

31. A semiconductor device in accordance with claim 30, in which the inversion layer control means has an impurity concentration of at least $1\times 10^{16}$ cm$^{31}$ $^3$.

32. A semiconductor device in accordance with claim 14 or 15, in which the inversion layer control means has an impurity concentration of not more than $3\times 10^{16}$ cm$^{-3}$.

33. A semiconductor device in accordance with claim 32, in which the inversion layer control means has an impurity concentration of at least $1\times 10^{16}$ cm$^{-3}$.

34. A semiconductor device in accordance with claim 18, in which the inversion layer control means has an impurity concentration of at least $1\times 10^{16}$ cm$^{-3}$.

35. A semiconductor device in accordance with claim 14 or 15, in which the inversion layer control means has an impurity concentration of at least $1\times 10^{16}$ cm$^{-3}$.

* * * * *

UNITED STATES PATENT AND TRADEMARK OFFICE
CERTIFICATE OF CORRECTION

PATENT NO. : 5,175,599
DATED : December 29, 1992
INVENTOR(S) : Masayuki Yoshida It is certified that error appears in the above-identified patent and that said Letters Patent is hereby corrected as shown below:

In the Abstract, line 1, change "$n^{30}$-type" to --$n^{+}$-type--.

In the Abstract, line 2 and 3, change "$p^{30}$-type" to --$p^{+}$-type--.

Claim 24, column 7, line 3, change "$10^{17}$" to --$10^{16}$--.

Claim 31, column 8, line 6, change "$cm^{31}$ $^{3}$" to --$cm^{-3}$--.

Signed and Sealed this

Eleventh Day of January, 1994

Attest:

BRUCE LEHMAN

*Attesting Officer*   *Commissioner of Patents and Trademarks*